(12) United States Patent
Esaki et al.

(10) Patent No.: US 11,330,748 B2
(45) Date of Patent: May 10, 2022

(54) ELECTRONIC COMPONENT MOUNTING METHOD AND ELECTRONIC COMPONENT MOUNTING MACHINE

(71) Applicant: FUJI CORPORATION, Chiryu (JP)

(72) Inventors: Hirotake Esaki, Ichinomiya (JP); Kenji Sugiyama, Anjo (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 43 days.

(21) Appl. No.: 16/644,673

(22) PCT Filed: Sep. 22, 2017

(86) PCT No.: PCT/JP2017/034338
§ 371 (c)(1),
(2) Date: Mar. 5, 2020

(87) PCT Pub. No.: WO2019/058518
PCT Pub. Date: Mar. 28, 2019

(65) Prior Publication Data
US 2021/0112693 A1    Apr. 15, 2021

(51) Int. Cl.
*H05K 3/30* (2006.01)
*H05K 13/08* (2006.01)
*H05K 13/04* (2006.01)

(52) U.S. Cl.
CPC ....... *H05K 13/0812* (2018.08); *H05K 13/041* (2018.08)

(58) Field of Classification Search
CPC ............. H05K 13/041; H05K 13/0812; H05K 13/0813
See application file for complete search history.

(56) References Cited

U.S. PATENT DOCUMENTS 10,226,798 B2 *  3/2019  Komiyama ........ H05K 13/0404
10,945,360 B2 *  3/2021  Sugita ................ H05K 13/0417
(Continued)

FOREIGN PATENT DOCUMENTS

JP      2012-134258 A    7/2012
WO   WO 2016/046967 A1   3/2016

OTHER PUBLICATIONS

International Search Report dated Dec. 19, 2017 in PCT/JP2017/034338 filed on Sep. 22, 2017.

*Primary Examiner* — Paul D Kim
(74) *Attorney, Agent, or Firm* — Oblon, McClelland, Maier & Neustadt, L.L.P.

(57) ABSTRACT

An electronic component mounting method including a preparatory imaging step of storing preparation position information of component holding sections obtained based on preparation images imaged with no electronic component held by the component holding sections and with a rotary head indexed to multiple indexing angles; a pick-up step of picking up electronic components; an angle information acquisition step of acquiring indexing angle information of the rotary head; a component imaging step of imaging the electronic components with the indexing angle of the rotary head made to coincide with an indexing angle of the rotary head that corresponds to the specific positional information; and a measurement step of measuring a positional deviation amount between a position of the multiple component holding sections that is recognized from the specific positional information and a position of the electronic component that is recognized from the component image obtained in the component imaging step.

9 Claims, 10 Drawing Sheets

(56) References Cited

U.S. PATENT DOCUMENTS

2004/0188642 A1  9/2004  Kodama et al.
2020/0221618 A1* 7/2020  Kawai ................ H05K 13/0815

* cited by examiner

ELECTRONIC COMPONENT MOUNTING METHOD AND ELECTRONIC COMPONENT MOUNTING MACHINE

TECHNICAL FIELD

The present application relates to an electronic component mounting method and an electronic component mounter.

BACKGROUND ART

There is known an electronic component mounter including a mounting head having a rotary head configured to rotate about a rotation axis parallel to the vertical direction and multiple component holding sections each capable of holding an electronic component, and a part camera configured to image the electronic components held by the rotary head and the multiple component holding sections from below. Patent Literature 1 discloses a technique in which an electronic component picked up by a suction nozzle is imaged by a part camera in the midst of being transferred to a mounting position on a circuit board, and the image of the electronic component is processed to determine the deviation amount of the suction position, orientation, and the like of the electronic component from a predetermined suction position, orientation, and the like.

Here, before the electronic component mounting work is performed, the rotary head is imaged by the part camera with no electronic components held on the component holding sections, and the positions of the component holding sections are obtained based on preparation image data obtained by the imaging. In the electronic component mounting work, the electronic component mounter images electronic components held by the multiple component holding sections using the part camera and measures a positional deviation amount between the position of the electronic component from the component image data, obtained by the imaging, and the position of the component holding section obtained from the preparation image data.

In this regard, in performing a mounting head exchange, there may be a case where a mounting head is mounted in such a state that the rotation axis of the mounting head is not strictly parallel to the vertical direction. In this case, the position of the component holding section in the image obtained through imaging with the part camera differs depending on the indexing angle of the rotary head. Therefore, in the electronic component mounter of the related art, the indexing angle of the rotary head when the electronic component held by the component holding section is imaged by the part camera is caused to match the indexing angle in the preparation image data.

Patent Literature 2 discloses a technique in which a deviation amount between a rotation center of a rotary head before a mounting head exchange and a rotation center of a rotary head after the rotary head exchange is calculated, and the position of an electronic component held by a nozzle is indexed using the calculated deviation amount as a calibration component.

PATENT LITERATURE

Patent Literature 1: WO 2016/046967
Patent Literature 2: JP-A-2012-134258

BRIEF SUMMARY

Technical Problem

However, in the case where the indexing angle of the rotary head when imaging the electronic component held by the component holding section using the part camera is made to coincide with the indexing angle in the preparation image data, if the difference between the indexing angle of the rotary head when the last electronic component of electronic components to be picked up is picked up and the indexing angle in the preparation image data is large, the rotation amount of the rotary head that is necessary for the rotary head to move from the component supply position to the imaging position of the part camera becomes large. In this case, there is a possibility that the indexing of the rotary head is not completed at the point in time at which the imaging position of the component camera is reached, and a certain length of waiting time is required before the part camera starts imaging, thereby reducing the efficiency of the electronic component mounting work.

An object of the present description is to provide an electronic component mounting method and an electronic component mounter which enable electronic component mounting work to be carried out efficiently.

Solution to Problem

The present description discloses an electronic component mounting method for an electronic component mounter comprising: a rotary head configured to move between a component supply position and a circuit board and to be indexed to multiple indexing angles by rotating about an axis parallel to the vertical direction; multiple component holding sections arranged in a circumferential direction centered at the axis of the rotary head and configured to hold electronic components; a part camera configured to image the electronic component held by each of the multiple component holding sections; a storage device configured to store an image obtained through imaging by the part camera; and an image processing device configured to process the image to thereby measure a positional deviation amount of the electronic component.

The electronic component mounting method comprises: a preparatory imaging step of storing in the storage device multiple pieces of preparation position information of the component holding sections that are obtained based on preparation images imaged by the part camera in such a manner that all the multiple component holding sections fall within the visual field of the part camera with the multiple component holding sections not holding the electronic components and with the rotary head indexed to multiple indexing angles; a pick-up step of picking up the electronic components with the component holding sections; an angular information acquiring step of acquiring indexing angle information of the rotary head when the electronic component, which constitutes the final electronic component of the electronic components, is picked up in the pick-up step; an extraction step of extracting specific positional information from the multiple pieces of preparation position information based on the indexing angle information and multiple indexing angles of the rotary head imaged in the preparatory imaging step; a component imaging step of imaging the electronic components held by the multiple component holding sections with the indexing angle of the rotary head made to coincide with the indexing angle of the rotary head that corresponds to the specific information; and a measuring step of measuring a positional deviation amount between a position of the multiple component holding sections that is recognized from the specific positional information and a position of the electronic component that is recognized from a component image obtained in the component imaging step.

Further, the present specification discloses an electronic component mounter comprising: a rotary head configured to move between a component supply position and a circuit board and to be indexed to multiple indexing angles by rotating about an axis parallel to the vertical direction; multiple component holding sections arranged in a circumferential direction centered at the axis of the rotary head and configured to hold electronic components; a part camera configured to image the electronic component held by each of the multiple component holding sections; a storage device configured to store an image obtained through imaging by the part camera; and an image processing device configured to process the image to thereby measure a positional deviation amount of the electronic component.

The image processing device comprises: a preparatory imaging section configured to image the multiple component holding sections using the part camera in such a manner that all the multiple component holding sections fall within the visual field of the part camera with the multiple component holding sections not holding the electronic components and with the rotary head indexed to multiple indexing angles and store multiple pieces of preparation position information of the component holding sections that are obtained based on imaged preparation images in the storage device; an angular information acquiring section configured to acquire indexing angle information of the rotary head when the component holding section picks up the electronic component which constitutes the final electronic component of the electronic components; an extraction section configured to extract specific positional information from the multiple pieces of preparation position information based on the indexing angle information and multiple indexing angles of the rotary head imaged by the preparatory imaging section; a component imaging section configured to image the electronic components held by the multiple component holding sections in such a manner that all the multiple component holding sections are fall within the visual field with the indexing angle of the rotary head made to coincide with the indexing angle of the rotary head based on the specific information; and a measuring section configured to measure a positional deviation amount between a position of the multiple component holding sections that is recognized from the specific positional information and a position of the electronic component that is recognized from a component image obtained through imaging by the component imaging section.

Advantageous Effects

In the electronic component mounting method of the present disclosure, the specific positional information is extracted from the multiple pieces of preparation position information in the extraction step, and in the component holding step, the electronic components held by the multiple component holding sections are imaged with the indexing angle of the rotary head made to coincide with the indexing angle of the rotary head that corresponds to the specific information. In this case, with the electronic component mounting method, compared with a case where there is one piece of preparation position information, a rotation amount of the rotary head that is necessary for the rotary head to arrive at the imaging position of the part camera from the component supply position can be reduced. Consequently, with the electronic component mounting method, since it is possible to suppress the generation of a waiting time between the point in time when the mounting head arrives at the imaging position of the part camera and the point in time when the part camera starts imaging, the mounting work of electronic components can be carried out with good efficiency.

According to the electronic component mounter of the present disclosure, the extraction section extracts the specific positional information from the multiple pieces of preparation position information, and the component imaging section images the electronic components held by the multiple component holding sections with the indexing angle of the rotary head made to coincide with the indexing angle of the rotary head that corresponds to the specific information. In this case, with the electronic component mounter, compared with a case where there is one piece of preparation position information, the rotation amount of the rotary head that is necessary for the rotary head to arrive at the imaging position of the part camera from the component supply position can be reduced. Consequently, with the electronic component mounter, since it is possible to suppress the generation of a waiting time between the point in time when the mounting head arrives at the imaging position of the part camera and the point in time when the part camera starts imaging, the mounting work of electronic components can be carried out with good efficiency.

DESCRIPTION OF EMBODIMENTS

1. First Embodiment 1-1. Schematic Configuration of Electronic Component Mounter 1

Hereinafter, embodiments to which an electronic component mounting method and an electronic component mounter disclosed in this description are applied will be described with reference to drawings. First, referring to FIG. 1, the configuration of an electronic component mounter 1 (hereinafter, referred to as "component mounter 1") according to a first embodiment will be described.

Figure 1:
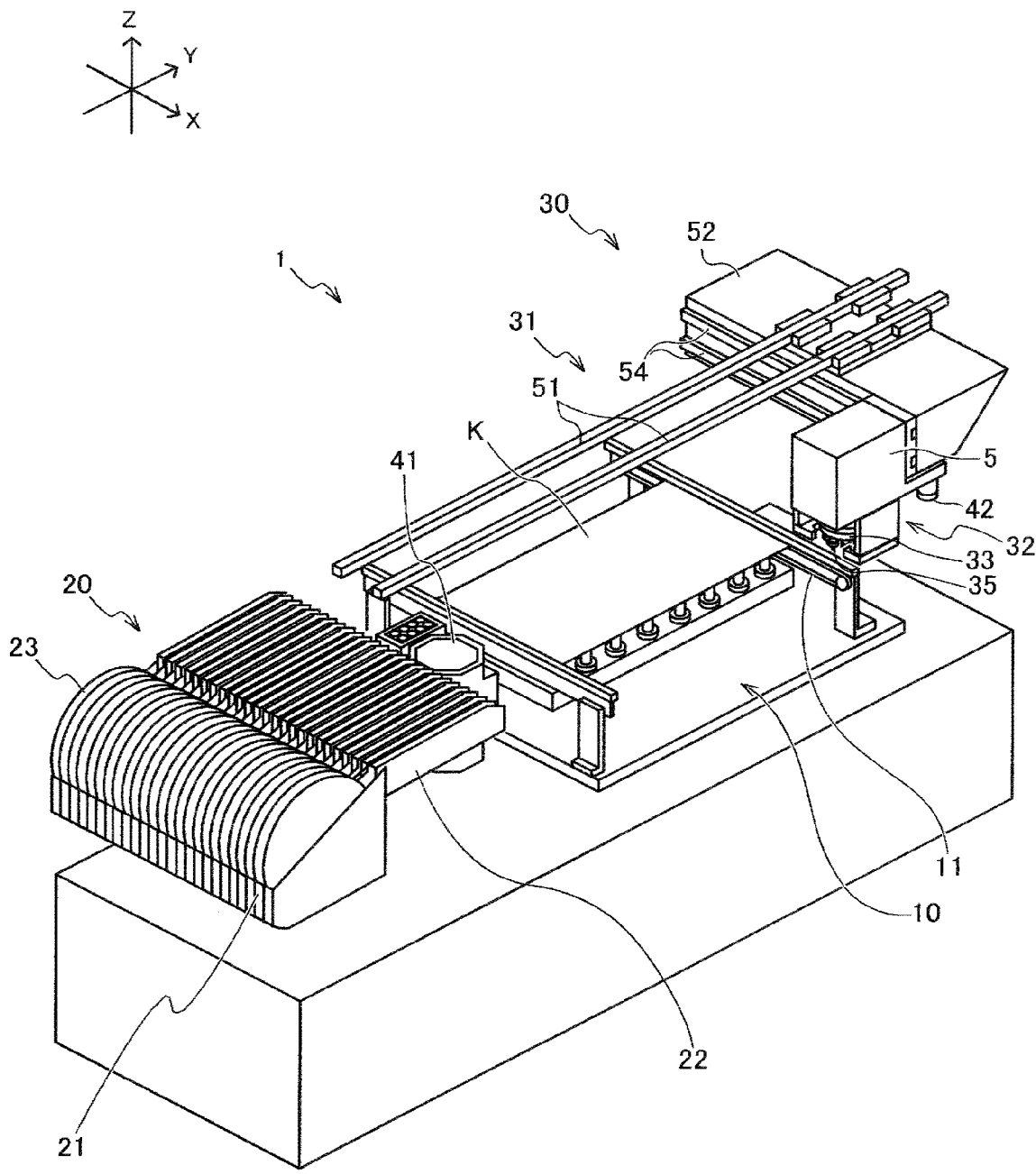
FIG. 1 is a perspective view of an electronic component mounter according to a first embodiment of the present description.
Figure 3:
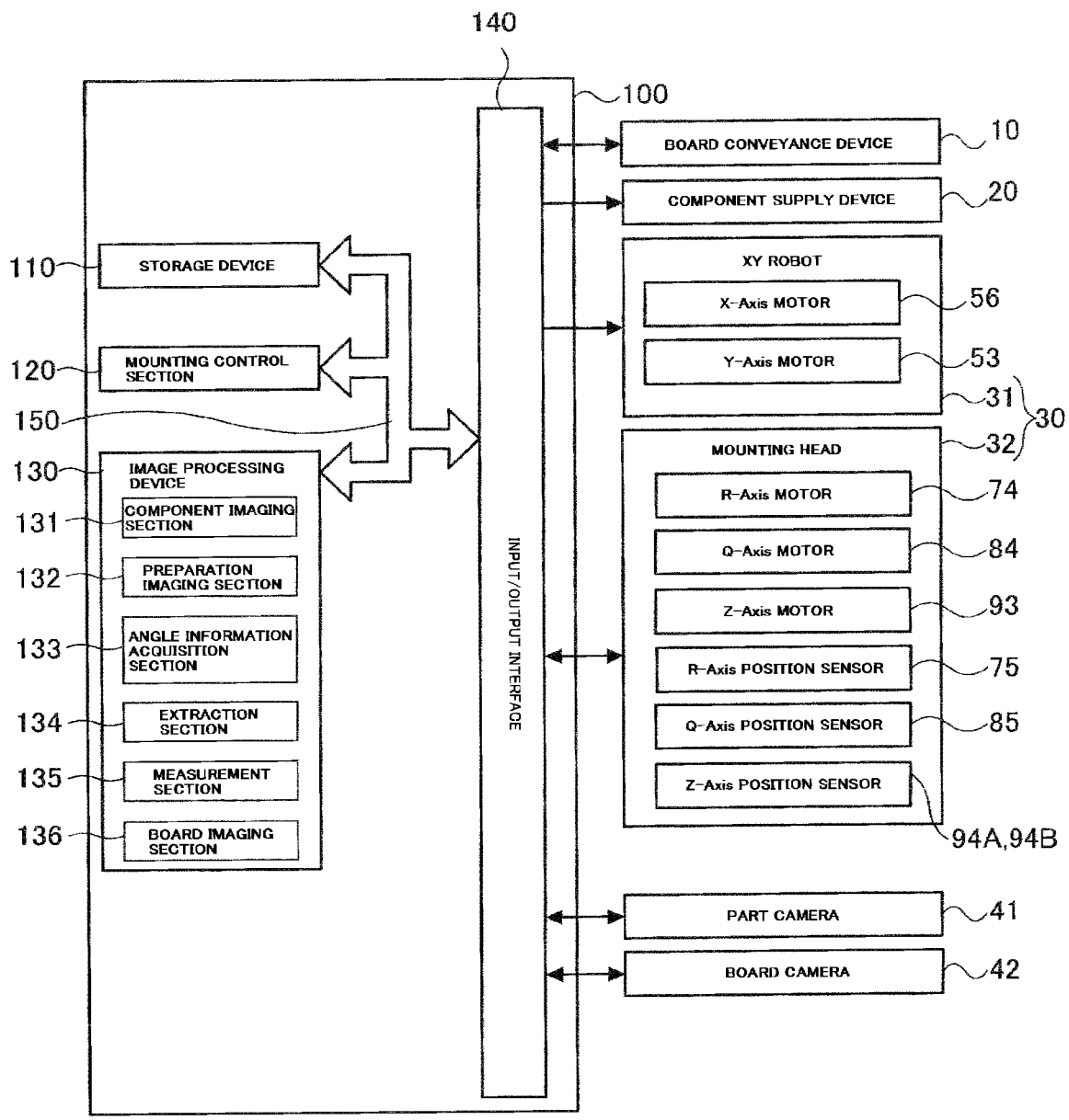
FIG. 3 is a block diagram of a control device.

As shown in FIG. 1, component mounter 1 mainly includes board conveyance device 10, component supply device 20, component transfer device 30, part camera 41, board camera 42, and control device 100 (refer to FIG. 3).

In the following description, a left-right direction of component mounter 1 is defined as an X-axis direction, a front-rear direction is defined as a Y-axis direction, and a vertical direction is defined as a Z-axis direction.

Board conveyance device 10 is made up of pair of belt conveyors 11 that are stretched in the X-axis direction. Board conveyance device 10 conveys circuit boards K fed in sequentially in the X-axis direction, and positions circuit board K conveyed to a predetermined position. When electronic component P (hereinafter, referred to as a "component P") is completely mounted on circuit board K that is positioned accordingly, board conveyance device 10 conveys circuit board K to the outside of component mounter 1.

Component supply device 20 supplies component P that is mounted on circuit board K. Component supply device 20 includes multiple slots 21 arranged in the X-axis direction. Further, component supply device 20 includes multiple feeders 22 that are set in multiple slots 21 in such a manner as to be exchanged. Feeder 22 feeds and moves a carrier tape wound around reel 23, and supplies components P installed on the carrier tape to a component supply position provided at the distal end side of feeder 22 (the top right-hand side in FIG. 1).

Component transfer device 30 picks up component P supplied by component supply device 20 and mounts component P so picked up on circuit board K positioned by board conveyance device 10. Component transfer device 30 mainly includes XY robot 31 and mounting head 32.

XY robot 31 includes pair of Y-axis guide rails 51, Y-axis slider 52, Y-axis motor 53 (refer to FIG. 3), pair of X-axis guide rails 54, X-axis slider 55, and X-axis motor 56 (refer to FIG. 3). Pair of Y-axis guide rails 51 are long members extending in parallel in the Y-axis direction. Y-axis slider 52 is bridged over pair of Y-axis guide rails 51, and is provided so as to be movable in the Y-axis direction by being driven by Y-axis motor 53. Pair of X-axis guide rails 54 are long members extending in parallel in the X-axis direction. X-axis slider 55 is attached to pair of X-axis guide rails 54, and moves in the X-axis direction by being driven by X-axis motor 56.

Mounting head 32 is detachably provided on X-axis slider 55, and can hold component P supplied to the component supply position. A detailed configuration of mounting head 32 will be described later.

Part camera 41 and board camera 42 are digital imaging devices having an imaging element such as a Charge Coupled Device (CCD) or a Complementary Metal Oxide Semiconductor (CMOS). Part camera 41 and board camera 42 perform imaging within a range that falls within the visual field thereof based on a control signal from control device 100, to which component camera 41 and board camera 42 are connected for communication, and transmit image data obtained through imaging to control device 100. Part camera 41 is fixed to a base of component mounter 1 so that an optical axis thereof is directed in the Z-axis direction, and images component P held by mounting head 32 from below. Board camera 42 is fixed to X-axis slider 55 so that an optical axis thereof is directed in the Z-axis direction, and images circuit board K from above.

1-2. Configuration of Mounting Head 32

Figure 2:
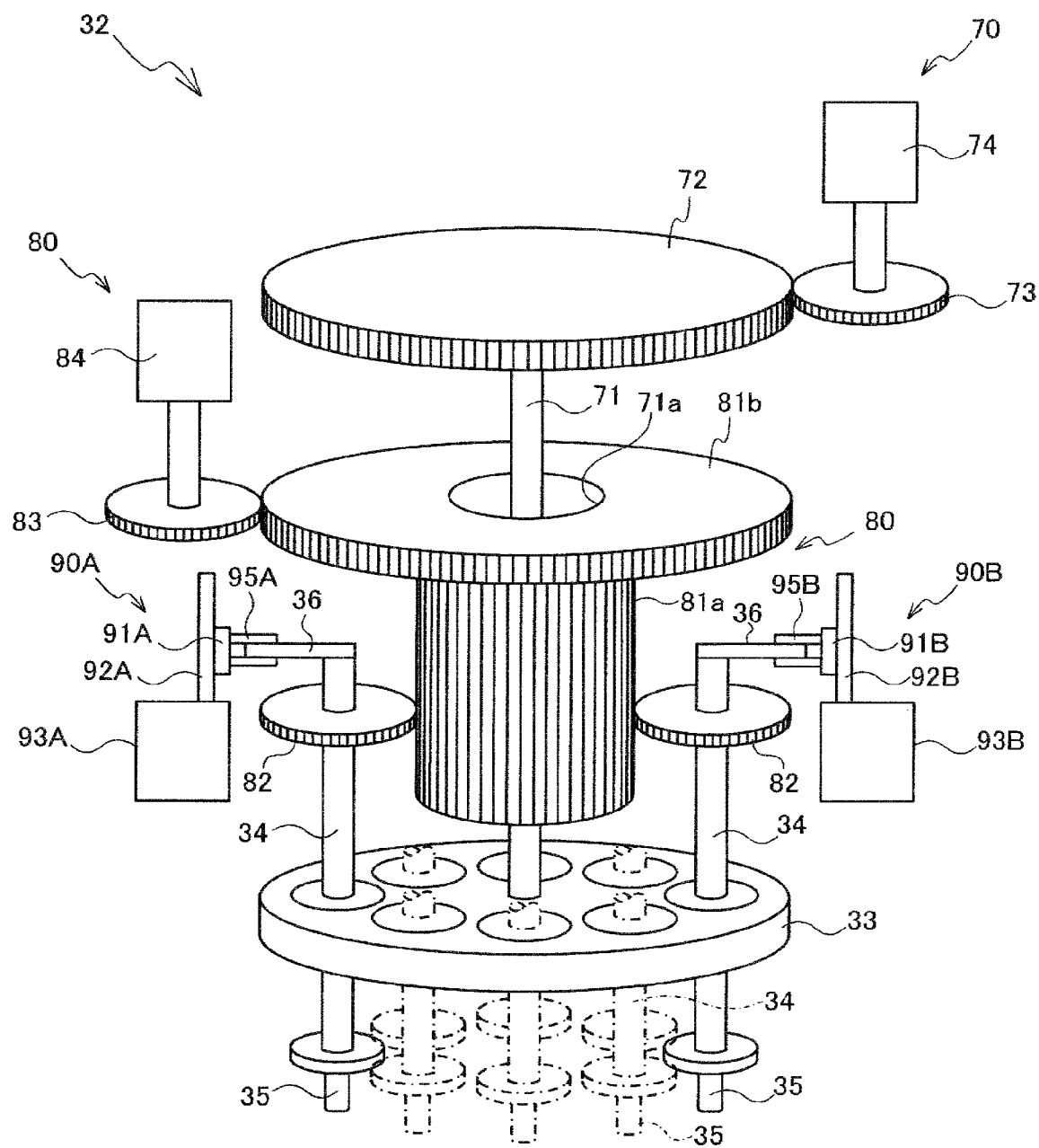
FIG. 2 is a diagram illustrating the configuration of a mounting head.

Here, a detailed configuration of mounting head 32 will be described with reference to FIG. 2. As shown in FIG. 2, mounting head 32 includes rotary head 33, eight nozzle holders 34, eight component holding sections 35, R-axis driving device 70, Q-axis driving device 80, first Z-axis driving device 90A, and second Z-axis driving device 90B. In FIG. 2, in order to simplify the illustration, two of eight nozzle holders 34 are illustrated by solid lines, and remaining nozzle holders 34 are only partially illustrated by alternate long and short dash lines. In FIG. 2, two of eight component holding sections 35 are illustrated by solid lines, and remaining component holding sections 35 are illustrated by alternate long and short dash lines.

Rotary head 33 is a rotating body that is indexed to multiple indexing angles by rotating about an R axis parallel to the Z-axis direction. Eight nozzle holders 34 and eight component holding sections 35 are arranged in a circumferential direction centered at the R-axis, and eight component holding sections 35 are detachably attached to respective lower end portions of eight nozzle holders 34. Rotary head 33 moves between the component supply position and circuit board K, and component holding section 35 holds component P supplied to the component supply position by suction.

Each nozzle holder 34 is supported in such a manner as to be raised from and lowered towards rotary head 33, and a spring, not shown, is inserted into each nozzle holder 34. The spring is disposed between nozzle gear 82, which will be described later, and rotary head 33 and biases nozzle gear 82 upwards towards rotary head 33.

Further, engagement piece 36 extending radially outwards as viewed from the direction of the R-axis is formed at the upper end of each nozzle holder 34. Nozzle holder 34 and component holding section 35 are lowered by engagement piece 36 being pushed down against the biasing force of the spring. Additionally, when the lowering pressure exerted by engagement piece 36 is released, nozzle holder 34 and component holding section 35 which are forcibly lowered by engagement piece 36 are raised by means of the biasing force of the spring.

R-axis driving device 70 is a device configured to cause component holding sections 35 to revolve around the R-axis by rotating rotary head 33 around the R-axis. R-axis drive device 70 includes R-axis member 71, R-axis driven gear 72, R-axis drive gear 73, R-axis motor 74, and R-axis position sensor 75 (refer to FIG. 3).

R-axis member 71 is a shaft member disposed concentrically with the R-axis. Rotary head 33 is fixed to the lower end of R-axis member 71, and rotary head 33 rotates around the R-axis as R-axis member 71 rotates. R-axis driven gear 72 is a gear fixed to the upper end of R-axis member 71, and R-axis drive gear 73 is a gear meshing with R-axis driven gear 72. R-axis motor 74 is a motor configured to provide a driving force for rotating R-axis drive gear 73, and R-axis drive gear 73 is coupled to drive shaft 74a of R-axis motor 74 in such a manner as to rotate together with drive shaft 74a. R-axis position sensor 75 is a sensor configured to detect a rotational position of R-axis motor 74, and for example, an encoder or the like is used as R-axis position sensor 75.

That is, the driving force of R-axis motor 74 is transmitted to rotary head 33 via R-axis drive gear 73, R-axis driven gear 72, and R-axis member 71. In this way, R-axis driving device 70 transmits the driving force of R-axis motor 74 to rotary head 33, thereby causing rotary head 33 to rotate around the R-axis.

Q-axis driving device 80 is a device configured to cause all component holding sections 35 to rotate around the Q-axis in a synchronized fashion. Q-axis drive device 80 includes Q-axis driven gear 81, eight nozzle gears 82, Q-axis drive gear 83, Q-axis motor 84, and Q-axis position sensor 85 (refer to FIG. 3). Q-axis driven gear 81 is a stepped gear in which two gears having different outer diameters, that is, small gear 81a and large gear 81b, are coupled together in such a manner as to rotate together. Insertion hole 71*a* through which R-axis member 71 is inserted is formed through Q-axis driven gear 81, and Q-axis driven gear 81 is disposed concentrically with R-axis member 71 and rotatable relative to R-axis member 71.

Nozzle gear 82 is a gear that meshes with small gear 81*a* of Q-axis driven gear 81, small gear 81*a* being the small gear having a small outer diameter. Small gear 81*a* has a larger length dimension in an axial direction than nozzle gear 82, and nozzle gear 82 slides in the Z-axis direction while kept meshing with small gear 81*a*. Eight nozzle gears 82 are individually fixed to eight nozzle holders 34 one by one in such a manner as to rotate together.

Q-axis drive gear 83 is a gear that meshes with large gear 81*b* of Q-axis driven gear 81, large gear 81*b* being the gear having a large outer diameter. Q-axis motor 84 is a motor configured to provide a driving force for rotating Q-axis drive gear 83. Q-axis drive gear 83 is coupled to drive shaft 84*a* of Q-axis motor 84 in such a manner as to rotate together with drive shaft 84*a*. Q-axis position sensor 85 is a sensor configured to detect the rotational position of Q-axis motor 84, and can be, for example, an encoder or the like.

That is, the driving force of Q-axis motor 84 is transmitted to nozzle holder 34 via R-axis drive gear 83, R-axis driven gear 81, and nozzle gear 82. In this way, Q-axis driving device 80 transmits the driving force of Q-axis motor 84 to nozzle holder 34, thereby causing component holding section 35 to rotate around a Q-axis.

First Z-axis driving device 90A and second Z-axis driving device 90B are lifting and lowering devices configured to lift and lower nozzle holders 34 in the Z-axis direction, and first Z-axis driving device 90A and second Z-axis driving device 90B are provided in positions that are offset in phase 180 degrees around the R-axis. First Z-axis driving device 90A and second Z-axis driving device 90B include Z-axis sliders 91A and 91B, ball screws 92A and 92B, Z-axis motors 93A and 93B, and Z-axis position sensors 94A and 94B (refer to FIG. 3). Z-axis sliders 91A and 91B are attached to ball screws 92A and 92B, respectively. Ball screws 92A and 92B lift and lower Z-axis sliders 91A and 91B, respectively, in the Z-axis direction by means of the driving force imparted from Z-axis motors 93A and 93B, and Z-axis position sensors 94A and 94B detect lifting and lowering positions of Z-axis sliders 91A and 91B, respectively.

Z-axis sliders 91A and 91B include pairs of vertically opposed gripping sections 95A and 95B that project radially inwards when viewed from the direction of the R-axis. A gap into which engagement piece 36 provided at the upper end of nozzle holder 34 can be inserted is provided between pair of gripping sections 95A and pair of gripping sections 95B, and engagement piece 36 is disposed in a position (a lifting or lowering position) corresponding to each of pairs of gripping sections 95A and 95B in the Z-axis direction in such a state that nozzle holder 34 is biased upwards by a spring (not shown).

When rotary head 33 rotates around the R axis, nozzle holder 34 revolves around the R axis, and engagement piece 36 passes between each of pairs of gripping sections 95A and 95B. Then, when rotary head 33 is indexed to indexing angles, circumferential positions of nozzle holders 34 as viewed from the direction of the R-axis coincide with circumferential positions of Z-axis sliders 91A and 91B as viewed from the direction of the R-axis, whereby engagement pieces 36 are inserted between corresponding pairs of gripping sections 95A and 95B. Then, first Z-axis driving device 90A and second Z-axis driving device 90B lower Z-axis sliders 91A and 91B with engagement pieces 36 kept inserted between corresponding pairs of gripping sections 95A and 95B. As a result, engaging pieces 36 are pushed downwards by corresponding gripping sections 95A and 95B in engagement, whereby nozzle holders 34 are lowered along with the lowering of Z-axis sliders 91A and 91B.

In this way, mounting head 32 picks up and mounts components P by lifting and lowering nozzle holders 34 and component holding sections 35 which are disposed in the lifting and lowering positions by first Z-axis driving device 90A and second Z-axis driving device 90B which constitute the lifting and lowering devices with rotary head 33 indexed to the indexing angles.

1-3. Control Device 100

Next, referring to FIG. 3, control device 100 will be described. As shown in FIG. 3, control device 100 mainly includes CPU, various types of memory, and the like. Control device 100 includes storage device 110, mounting control section 120, image processing device 130, and input/output interface 140. Storage device 110, mounting control section 120, image processing device 130, and input/output interface 140 are connected to one another via bus 150.

Detection signals from various motors of XY robot 31, detection signals from various motors and various sensors of mounting head 32, image signals from part camera 41 and board camera 42, and the like are input into control device 100 via input/output interface 140. Control signals and the like are outputted from mounting control section 120 and image processing device 130 to board conveyance device 10, component supply device 20, the various motors of XY robot 31, the various motors and various sensors of mounting head 32, part camera 41, and board camera 42 via input/output interface 140.

Storage device 110 is made up of an optical drive device such as a hard disk device, a flash memory, or the like. Storage device 110 stores control programs, control information, images obtained through imaging by part camera 41 and board camera 42, information obtained from the images, and the like.

Mounting control section 120 controls positions and rotation angles of mounting head 32 and component holding sections 35. Specifically, mounting control section 120 inputs information outputted from the various motors, the various sensors, and the like, the results of various recognition processes, and the like. Then, mounting control section 120 outputs control signals to board conveyance device 10, component supply device 20, and component transfer device 30 based on the control programs and control information stored in storage device 110, information by the various sensors, and the results of image processing and recognition processing. Image processing device 130 acquires images imaged by part camera 41 and board camera 42, and executes image processing in accordance with applications.

1-4. Image Processing Device 130

Image processing device 130 includes component imaging section 131, preparatory imaging section 132, angle information acquisition section 133, extraction section 134, measurement section 135, and board imaging section 136.

When component holding sections 35 pick up all components P to be picked up, component imaging section 131 images components P held by component holding sections 35 using part camera 41 in such a manner that all component holding sections 35 fall within the visual field of part camera 41.

With no component P held by component holding sections 35, preparatory imaging section 132 images mounting head 32 using part camera 41 in such a manner that all component holding sections 35 fall within the visual field of part camera 41. That is, when part camera 41 images mounting head 32 from below with components P held by component holding sections 35, the positions of component holding sections 35 hidden behind components P cannot be obtained from an image obtained through such imaging.

Then, image processing device 130 causes preparatory imaging section 132 to image component holding sections 35 before component mounter 1 starts mounting work of mounting components P as a preparation, and stores data relating to center coordinates 35P of component holding sections 35 that is obtained based on preparation images g obtained through the imaging in storage device 110 as preparation positional information.

Here, in component mounter 1, an imaging position taken by component imaging section 131 coincides with an imaging position taken by preparatory imaging section 132. However, since mounting head 32 is detachably mounted on XY robot 31, the R axis, which is a rotation axis of rotary head 33, and the Q axis, which is a rotation axis of nozzle holder 34 and component holding section 35, are not necessarily strictly parallel to the Z-axis direction. That is, there is a possibility that mounting head 32 is mounted on XY robot 31 with the R axis or the Q axis slightly inclined with respect to the Z axis direction. In this case, even if mounting head 32 is imaged at the same position, when an indexing angle of rotary head 33 differs, a positional deviation is generated at the position of component holding section 35 in an image obtained through imaging.

Figure 4:
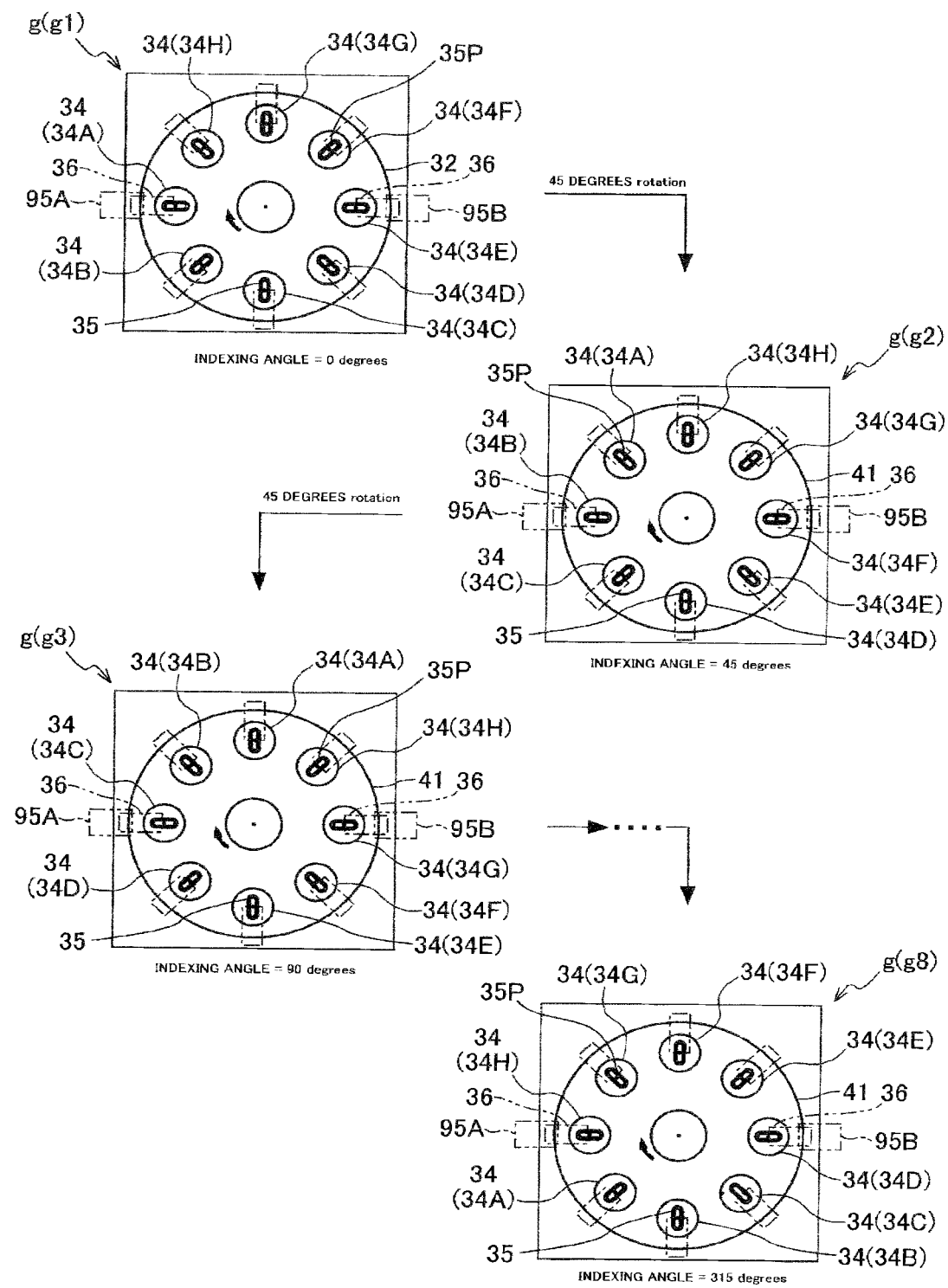
FIG. 4 is a diagram illustrating a preparation image obtained by imaging the mounting head every time a rotary head is indexed to an indexing angle.

Therefore, as shown in FIG. 4, preparatory imaging section 132 images mounting head 32 using part camera 41 with rotary head 33 indexed to all the indexing angles thereof. Specifically, in the present embodiment, since mounting head 32 includes eight component holding sections 35, mounting head 32 is imaged by part camera 41 every time rotary head 33 is rotated through an indexing angle of 45 degrees. Then, preparatory imaging section 132 obtains center coordinates 35P of component holding sections 35 for each of a total of eight patterns of preparation images g1 to g8 that are obtained through imaging, and stores the data relating to the obtained center coordinates 35P in storage device 110 while associating the data with the indexing angles of rotary head 33 for imaging.

In FIG. 4, engagement piece 36 of nozzle holders 34, as well as pair of gripping sections 95A of first Z-axis drive device 90A and pair of gripping sections 95B of second Z-axis drive device 90B, which are not visible in the preparation images g1 to g8, are illustrated by chain double-dashed lines.

Image processing device 130 defines the indexing angle of one the eight patterns of rotary head 33 as 0 degrees. Then, in the present embodiment, component holding section 35 attached to nozzle holder 34 whose engagement piece 36 is inserted into pair of gripping sections 95A of first Z-axis drive device 90A when the indexing angle of rotary head 33 is 0 degrees is defined as "first component holding section 35A". Further, component holding section 35 attached to nozzle holder 34 whose engagement piece 36 is inserted into pair of gripping sections 95A when the indexing angle of rotary head 33 is 45 degrees is defined as "second component holding section 35B". Similarly, component holding sections 35 attached to nozzle holders 34 whose engagement pieces 36 are inserted into pair of gripping sections 95A when the indexing angle of rotary head 33 is 90 degrees to 315 degrees are defined as "third component holding section 35C to eighth component holding section 35H", respectively.

Here, in the case where there is one piece of preparation position information that is stored in storage device 110 (data on center coordinates 35P of component holding sections 35), mounting head 32 needs to make the indexing angle of rotary head 33 coincide with the indexing angle of rotary head 33 in the preparation position information between the point in time when final component P in the components to be picked up is completely picked up by component holding section 35 to the point in time when part camera 41 starts imaging. Therefore, in the case where a required amount of rotation of rotary head 33 is great, there is a possibility that the rotation (indexing) of rotary head 33 is not completed until mounting head 32 arrives at the imaging position taken by part camera 41. In this case, part camera 41 cannot start imaging, and hence, control device 100 has to have a waiting time.

On the other hand, image processing device 130 obtains the center coordinates 35P of component holding sections 35 for each of the eight patterns of preparation images g1 to g8 imaged by part camera 41 with rotary head 33 indexed to each of all the indexing angles thereof, and stores center coordinates 35P as preparation position information in storage device 110.

Therefore, control device 100 can cause component camera 41 to image component holding sections 35 after mounting head 32 is moved from the component supply position to the imaging position taken by part camera 41 with the indexing angles of rotary head 33 maintained irrespective of the indexing angle of rotary head 33 when final component P in the components P to be picked up is picked up by component holding section 35. That is, control device 100 does not need to rotate rotary head 33 while mounting head 32 moves from the component supply position to the imaging position taken by part camera 41, and part camera 41 can start imaging immediately after mounting head 32 arrives at the imaging position of part camera 41. As a result, component mounter 1 can smoothly perform the mounting work of mounting components P.

Angle information acquisition section 133 acquires indexing angle information of rotary head 33. In the present embodiment, image processing device 130 causes angle information acquisition section 133 to acquire indexing angle information of rotary head 33 when final component P in the components to be picked up is picked up by component holding section 35.

Extraction section 134 extracts, as specific position information, preparation position information associated with an indexing angle corresponding to the indexing angle of rotary head 33 acquired by angle information acquisition section 133 from the eight patterns of preparation position information stored in storage device 110.

Measurement section 135 compares component image G obtained by component imaging section 131 through imaging by part camera 41 with the specific position information extracted by extraction section 134, and measures an amount of positional deviation between the position of each of component holding sections 35 recognized from the specific position information and the position of corresponding component P recognized from component image G.

Board imaging section 136 causes board camera 42 to image a board mark (not shown) provided on circuit board K. Mounting control section 120 calculates a mounting position of component P on circuit board K based on the position of a reference mark and the positional deviation amount obtained through measurement by measurement section 135, and mounts component P onto the mounting position obtained through calculation.

1-5. Summary of Component Mounting Process

Figure 6:
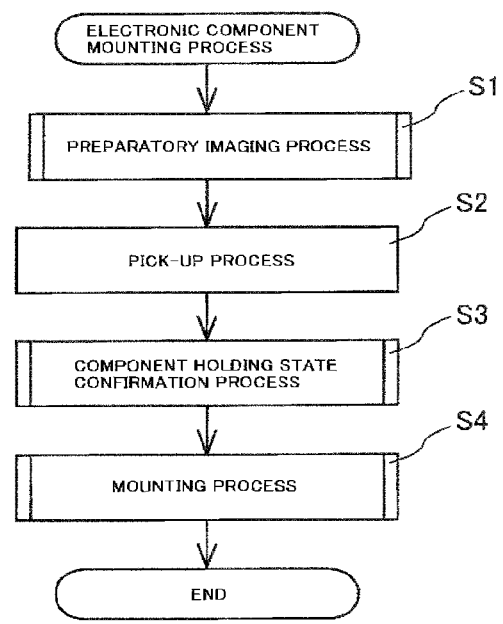
FIG. 6 is a flowchart of an electronic component mounting process executed by the control device.

Next, a component mounting process executed by control device 100 will be described roughly by reference to a flow chart shown in FIG. 6. As shown in FIG. 6, in the component mounting process, control device 100 firstly executes a preparatory imaging process (S1: a preparatory imaging process). The preparatory imaging process S1 is a process of causing part camera 41 to image mounting head 32 holding no component P every time rotary head 33 is indexed to each of the indexing angles. Then, in the preparatory imaging process S1, data relating to center coordinates 35P of component holding sections 35 obtained based on the eight patterns of preparation images g1 to g8 obtained through imaging by part camera 41 is stored in storage device 110 as preparation position information.

After the preparatory imaging process (S1) is completed, control device 100 executes a pick-up process (S2: pick-up process). The sampling process (S2) is a process of picking up components P supplied to the component supply position by component holding sections 35. After the pick-up process (S2) is completed, control device 100 executes a component holding state confirmation process (S3). This component holding state confirmation process S3 is a process of confirming a positional deviation amount of component P with respect to the position of component holding section 35. After the component holding state confirmation process (S3) is completed, control device 100 executes a mounting process (S4). This mounting process (S4) is a process of mounting the component held by component holding section 35 onto circuit board K.

Figure 7:
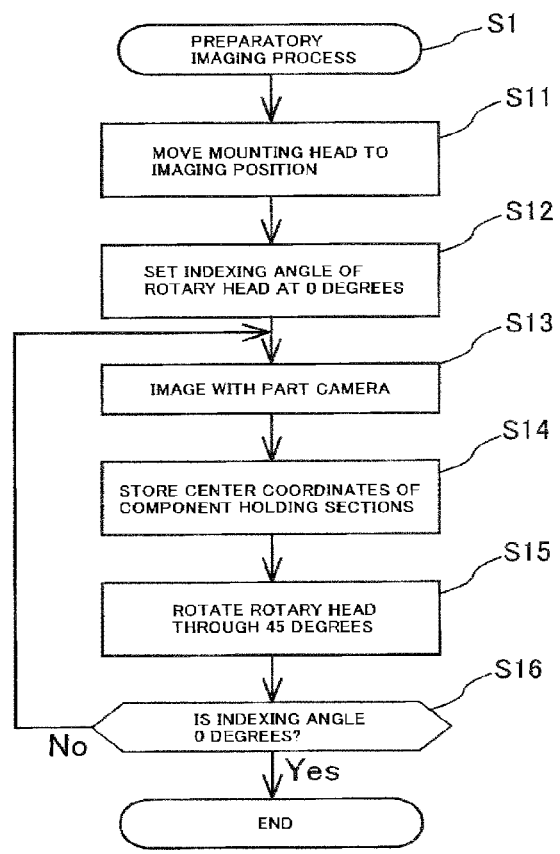
FIG. 7 is a flowchart of a preparatory imaging process executed in a component mounting process.

Next, referring to a flow chart shown in FIG. 7, the preparatory imaging process (S1) that is executed in the component mounting process will be described. As shown in FIG. 7, in the preparatory imaging process (S1), mounting control section 120 causes mounting head 32 to move to the imaging position of part camera 41 (S11). Next, in the preparatory imaging process (S1), mounting control section 120 sets the indexing angle of rotary head 33 at 0 degrees (S12).

Thereafter, in the preparatory imaging process (S1), preparation imaging section 132 causes part camera 41 to image mounting head 32 (S13). Then, in the preparatory imaging process S1, center coordinates 35P of component holding sections 35 obtained based on the preparation images g obtained in the process of S13 are stored in storage device 110. Subsequently, in the preparatory imaging process (S1), mounting control section 120 causes rotary head 33 to rotate through 45 degrees around the R axis (S15), thereafter mounting control section 120 determines whether the indexing angle of rotary head 33 is 0 degrees (S16).

In the process of S16, if the indexing angle of rotary head 33 is not 0 degrees (S16:No), the preparation imaging process (S1) returns to the process of S13, where part camera 41 is caused to image mounting head 32. The processes from S13 to S15 are repeated the same number of times as the number of indexing angles of rotary head 33, and when rotary head 33 arrives at 0 degrees after the process of S14 (S16:Yes), the preparatory imaging process (S1) determines that the imaging of rotary head 33 at every indexing angle has all been completed, ending the present process.

In this way, in the preparatory imaging process S1, center coordinates 35P of component holding sections 35 are obtained based on the preparation images g1 to g8 with rotary head 33 indexed to each of all the indexing angles thereof, and obtained center coordinates 35P of component holding sections 35 are stored in storage device 110 as preparation positional information. In the process of S13, preparation imaging unit 132 causes part camera 41 to image component holding sections 35 in such a manner that all of component holding sections 35 fall within the visual field of part camera 41. As a result, in the preparatory imaging process (S1), the time required for the process of S13 can be reduced.

Figure 8:
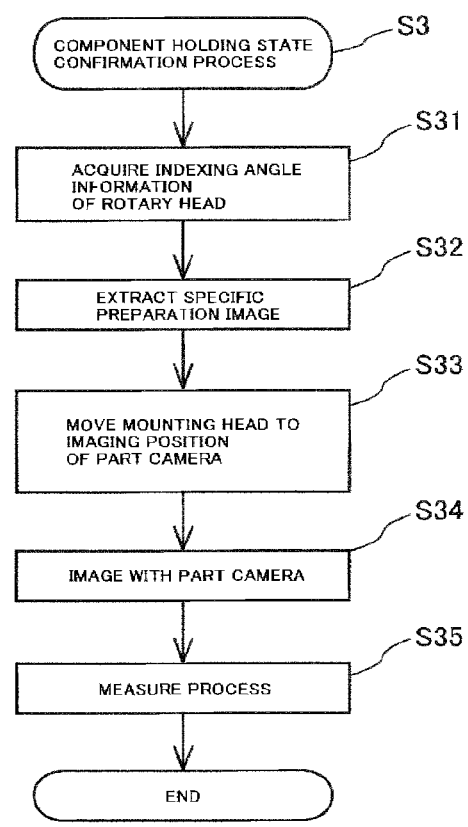
FIG. 8 is a flowchart of a component holding state confirmation process executed in the component mounting process.

Next, referring to a flow chart shown in FIG. 8, the component holding state confirmation process (S3) that is executed in the component mounting process will be described. As shown in FIG. 8, in the component holding state confirmation process (S3), firstly, angle information acquisition section 133 is caused to acquire the indexing angle of rotary head 33 for final component P in the components P to be picked up in the pick-up process (S2) (S31: angle information acquisition step).

Subsequently, in the component holding state confirmation process (S3), extraction unit 134 is caused to extract the specific position information corresponding to the indexing angle of rotary head 33 acquired by angle information acquisition section 133 from the eight patterns of preparation position information stored in storage device 110 (S32: extraction step).

In the component holding state confirmation process (S3), mounting control section 120 is caused to move mounting head 32 to the imaging position of part camera 41 (S33). The process of S33 is performed in parallel with the processes of S31 and S32. After the processes of S31 to S33, in the component holding state confirmation process (S3), component imaging section 131 causes part camera 41 to image components P held by component holding sections 35 in such a manner that all of component holding sections 35 fall within the visual field of part camera 41 (S34: component imaging step). In the process of S34, component imaging section 131 causes part camera 41 to perform imaging in such a manner that all of component holding sections 35 fall within the visual field of part camera 41, whereby the time required for the process of S34 can be reduced.

After the process of S34, in the component holding state confirmation processing (S3), measurement section 135 is caused to measure a positional deviation amount between the position of component holding section 35 recognized from the specific position information (the position of center coordinate 35P) and the position of component P recognized from component image G obtained in the process of S34 (S35: measurement step). After the process of S35, component mounting process ends the component holding state confirmation process (S3) and proceeds to the mounting process (S4).

Figure 9:
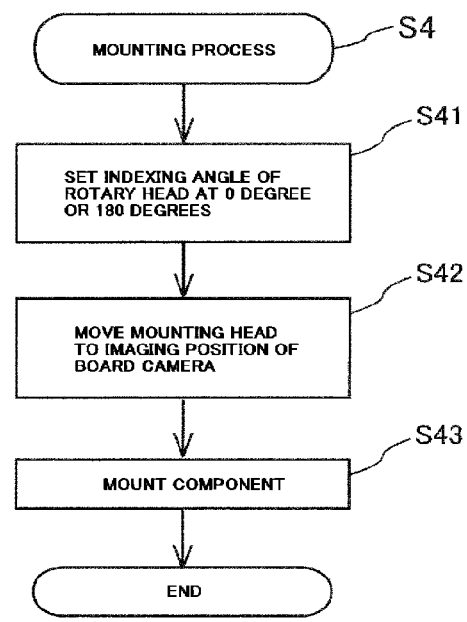
FIG. 9 is a flowchart of a mounting process executed in the component mounting process.

Next, referring to a flow chart shown in FIG. 9, the mounting process S4 executed in the component mounting process will be described. As shown in FIG. 9, in the mounting process (S4), firstly, mounting control section 120 is caused to set the indexing angle of rotary head 33 at 0 degrees or 180 degrees (S41: pre-mounting indexing step). The process of S41 is a process that is performed to start the mounting of components P onto circuit board K from component P held by first component holding section 35A. That is, in S41, engagement piece 36 of nozzle holder, 34 on which first component holding section 35A is mounted, is disposed in a position (a lifting or lowering position) corresponding to either of pair of gripping sections 95A of first Z-axis driving device 90A or pair of gripping sections 95B of second Z-axis driving device 90B. In addition, in the mounting process (S4), in parallel with the process of S41, mounting control section 120 causes mounting head 32 to move to the imaging position taken by board camera 42 (S42).

In this case, in indexing rotary head 33 in parallel with moving mounting head 32, component mounter 1 can secure a long time to index rotary head 33 due to a long time being required for mounting head 32 to move from the imaging position of part camera 41 to circuit board K (to the imaging position of board camera 42). Therefore, in the electronic component mounting process, since it is possible to suppress the generation of a waiting time between the point in time when mounting head 32 arrives at the imaging position of part camera 41 and the point in time when part camera 41 starts imaging, the mounting work of components P can be carried out with good efficiency.

In the present embodiment, component mounter 1 includes the multiple Z-axis drive devices (first Z-axis drive device 90A and second Z-axis drive device 90B) as lifting and lowering devices. Therefore, in the mounting process (S4), the rotation amount of rotary head 33 can be reduced in the process of S41. Therefore, in the electronic component mounting process, since the generation of a waiting time for indexing rotary head 33 can be suppressed before mounting of component P held by first component holding section 35A is started, the mounting work of components P can be carried out with good efficiency.

After the processes of S41 and S42, in the mounting process (S4), the mounting control section 120 causes components P held by component holding sections 35 to be mounted onto circuit board K. At this time, control device 100 causes image processing device 130 to image a board mark provided on circuit board K with board camera 42. Then, mounting control section 120 mounts component P on to the position that is calculated based on the positional deviation amount measured by measurement section 135.

Thus, as has been described heretofore, in the electronic component mounting process, in the component holding state confirmation process (S3), extraction section 134 extracts the specific preparation image from the eight patterns of preparation position information, and images components P held by eight component holding sections 35 with the indexing angle of rotary head 33 made to coincide with the indexing angle of rotary head 33 that corresponds to the specific position information. In this case, compared with a case where there is one piece of preparation position information, the rotation amount of rotary head 33 required for mounting head 32 to arrive at the imaging position of part camera 41 from the component supply position can be reduced. As a result, in the electronic component mounting process, it is possible to reduce the time required for indexing rotary head 33 while mounting head 32 moves from the component supply position to the imaging position of part camera 41.

In particular, in the process of S1, preparation imaging section 132 obtains center coordinates 35P of component holding sections 35 based on the preparation images g1 to g8 of eight patterns imaged by part camera 41 with rotary head 33 indexed to each of all the indexing angles thereof and stores center coordinates 35P so obtained as preparation position information. Then, in the process of S34, component imaging section 131 images components P held by component holding sections 35 at the indexing angle of rotary head 33 resulting when final component P is picked up in the pick-up process (S2).

Consequently, in the electronic component mounting process, it is possible to avoid the generation of a waiting time for indexing rotary head 33 between the point in time when mounting head 32 arrives at the imaging position of part camera 41 and the point in time when camera 41 starts imaging. Therefore, component mounter 1 can efficiently perform the mounting work of mounting components P.

2. Second Embodiment

Next, a second embodiment will be described. In the first embodiment, in the preparatory imaging process, preparation imaging section 132 images mounting head 32 at all the indexing angles of rotary head 33. On the other hand, in the second embodiment, preparation imaging section 132 images mounting head 32 at some indexing angles of all indexing angles of rotary head 33. Like reference signs will be given to like constituent elements to those of the first embodiment, and the description thereof will be omitted here.

2-1. Preparatory Imaging Process

Firstly, a preparatory imaging process according to the second embodiment will be described. In the present embodiment, preparation imaging unit 132 causes part camera 41 to image mounting head 32 with rotary head 33 indexed to indexing angles of two of the eight patterns. Specifically, in the preparatory imaging process S1 of the first embodiment, rotary head 33 is rotated through 45 degrees in the process of S15, whereas in the preparatory imaging process of the second embodiment, rotary head 33 is rotated through 180 degrees in a process corresponding to the process of S15. As a result, in the preparatory imaging process of the second embodiment, storage device 110 stores two patterns of preparation position information that are obtained based on preparation images g1 and g5 imaged with rotary head 33 indexed to indexing angles of 0 degrees and 180 degrees.

2-2. Component Holding State Confirmation Process 2

Next, referring to FIG. 10, a component holding state confirmation process 2 that is executed by control device 100 will be described. The component holding state confirmation process 2 is a process that is executed in place of the component holding state confirmation process (S3) executed in the component mounting process described in the first embodiment.

Figure 10:
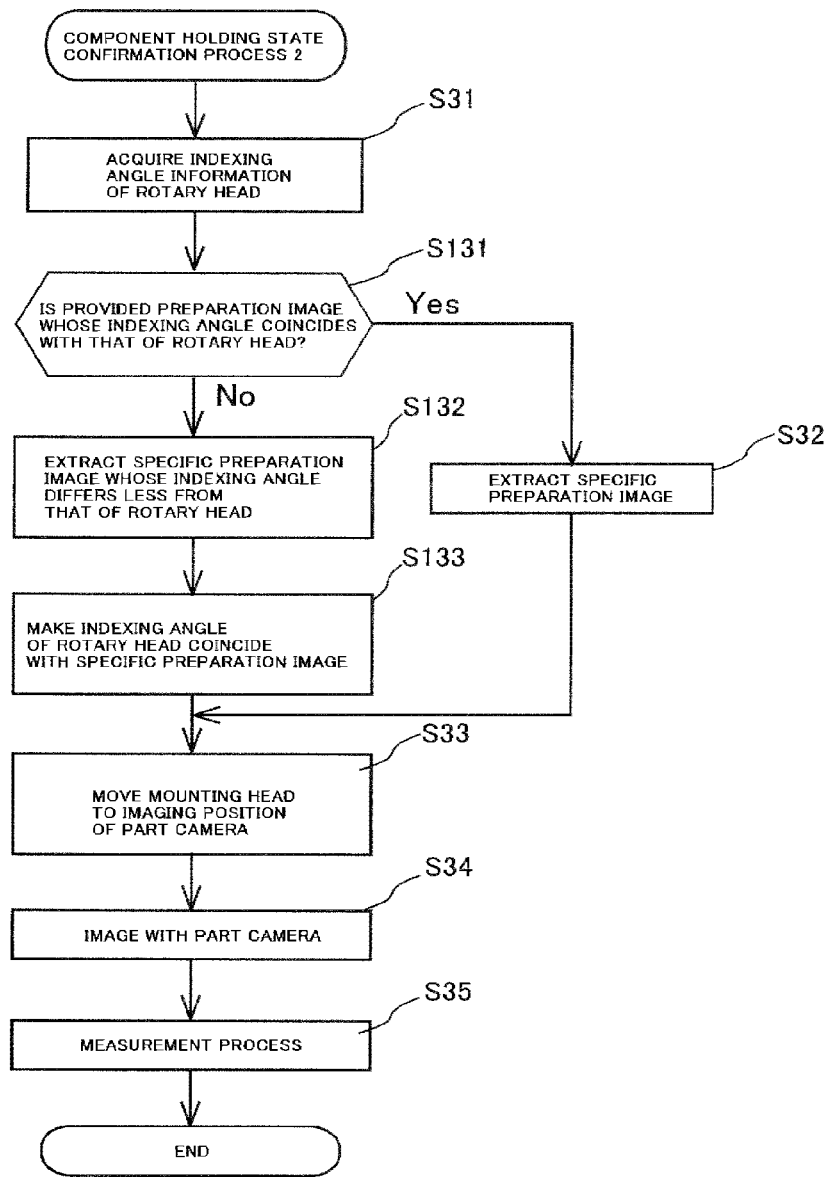
FIG. 10 is a flowchart of a second component holding state confirmation process executed in a component mounting process according to a second embodiment.

As shown in FIG. 10, in the component holding state confirmation process 2, an indexing angle of rotary head 33 when final component P in components to be picked up is picked up in a pick-up process is acquired (S31). Following this, in the component holding state confirmation process 2, a determination is made on whether the indexing angle of rotary head 33 coincides with either of the indexing angles of the two patterns of preparation position information stored in storage device 110 based on the angle information acquired in the process of S31 (S131).

Then, if the indexing angle of rotary head 33 coincides with either of the indexing angles of the preparation position information (S131:Yes), in the component holding state confirmation process 2, extraction section 134 is caused to extract the preparation position information whose indexing angle coincides with the indexing angle of rotary head 33 as specific positional information (S32: extraction step), and the component holding state confirmation process 2 proceeds to the process of S33.

On the other hand, if the indexing angle of rotary head 33 coincides with neither of the indexing angles of the two patterns of preparation position information (S131: No), in the component holding state confirmation process 2, extraction section 134 is caused to extract, of the two patterns of preparation position information, the preparation position information whose indexing angle differs less from the indexing angle of rotary head 33 as specific positional information (S132: extraction process). Then, in the component holding state confirmation process 2, mounting control section 120 is caused to make the indexing angle of rotary head 33 coincide with the indexing angle of the specific positional information (S133: pre-component imaging indexing process), and the component holding state confirmation process 2 proceeds to the process of S33.

Therefore, in the component holding state confirmation process 2, even when no positional information corresponding to the indexing angle of rotary head 33 is stored in storage device 110, a rotation amount of rotary head 33 required for mounting head 32 to move from the component supply position to the imaging position of part camera 41 can be reduced. Consequently, in the electronic component mounting process, it is possible to suppress the generation of a waiting time for indexing rotary head 33 between the point in time when mounting head 32 arrives at the imaging position of part camera 41 and the point in time when part camera 41 starts imaging.

In addition, in the component holding status checking process 2, the process of S33 is performed in parallel with the processes S31, S131 to S133. Then, in the component holding state confirmation process 2, from the process of S33 onwards, the same processes as the component holding state confirmation process (S3) of the first embodiment are performed accordingly.

Figure 5:
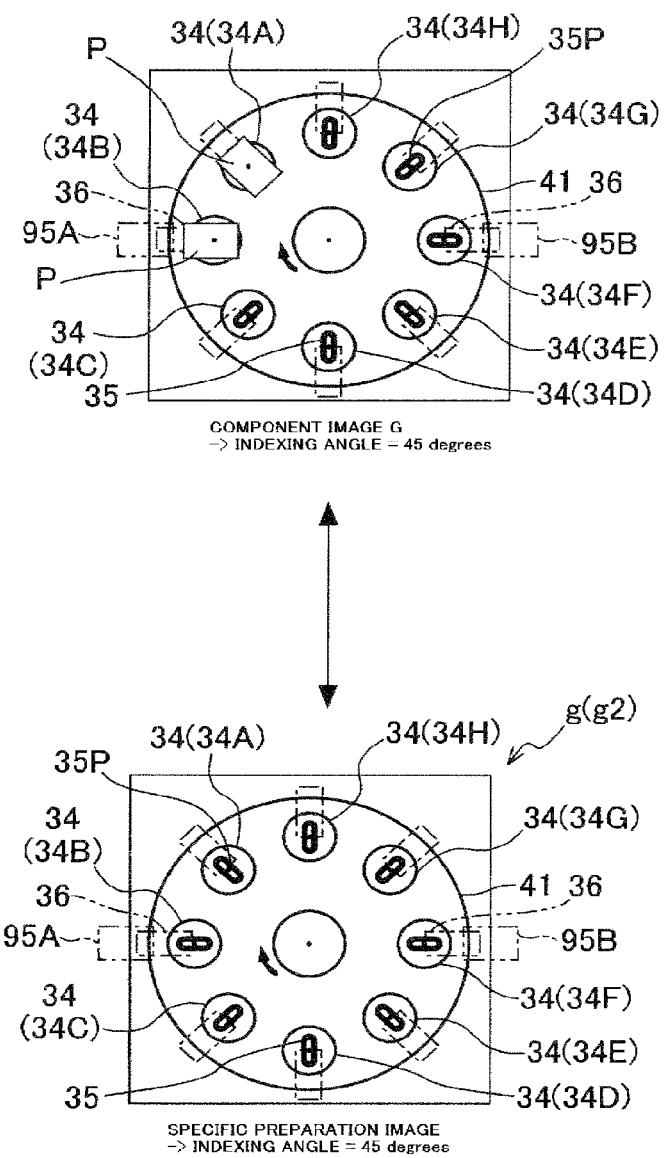
FIG. 5 is a diagram illustrating a component image and a specific preparation image.

Here, the process of S133 will be described by taking as an example a case where the indexing angle of rotary head 33 when final component P is picked up in the pick-up process (S2) is 45 degrees (refer to FIG. 5). In this case, if rotary head 33 can rotate only in one direction (a clockwise direction in FIG. 5), mounting control section 120 causes rotary head 33 through 135 degrees in the clockwise direction shown in FIG. 5 and sets the indexing angle of rotary head 33 at 180 degrees. On the other hand, if rotary head 33 can rotate in both directions, mounting control section 120 causes rotary head 33 to rotate in a counterclockwise direction shown in FIG. 5 and sets the indexing angle of rotary head 33 at 0 degrees.

In this way, in the process of S133, extraction section 134 extracts the specific position information from the two patterns of prepared position information so that the rotational amount from the indexing angle of rotary head 33 at which final component P is picked up in the pick-up process (S2) to the indexing angle of rotary head 33 at which part camera 41 is caused to perform imaging is minimized. Consequently, in the component holding state confirmation process 2, in the process of S133, the rotational amount of rotary head 33 required for mounting head 32 to move from the component supply position to the imaging position of part camera 41 can be reduced.

Consequently, in the electronic component mounting process, it is possible to suppress the generation of a waiting time for indexing rotary head 33 between the point in time when mounting head 32 arrives at the imaging position of part camera 41 and the point in time when part camera 41 starts imaging. Therefore, component mounter 1 can efficiently perform the mounting work of mounting components P.

3. Other

Although the component mounting method and the component mounter disclosed in this description have been described based on the embodiments described above, the present disclosure is not limited to the above-mentioned embodiments in any way, and it can be easily inferred that various modifications and improvements can be made without departing from the spirit and scope of the present disclosure.

For example, in each of the embodiments described above, although mounting head 32 is described as including the multiple lifting and lowering devices (first Z-axis driving device 90A and second Z-axis driving device 90B), the component mounting method disclosed in this description can, of course, be applied to component mounter 1 including mounting head 32 having only one Z-axis driving device.

Additionally, in the second embodiment described above, although preparation imaging section 132 is described as storing the indexing angles of the two patterns in the indexing angles of eight patterns of rotary head 33 in storage device 110, preparation imaging section 132 may store the indexing angles of three or more patterns in storage device 110. In this case, mounting head 32 can reduce the rotation amount of rotary head 33 from the component supply position to the imaging position of part camera 41. As a result, with the component holding state confirmation process 2, since time required for indexing rotary head 33 can be reduced, it is possible to suppress the generation of a waiting time for part camera 41 to start imaging.

Further, in the first embodiment, rotary head 33 is described as not being indexed while mounting head 32 moves from the component supply position to the imaging position of part camera 41 but being indexed while mounting head 32 moves from the imaging position of part camera 41 to the imaging position of board camera 42. However, the present disclosure is not limited to this, and hence, the required rotation of rotary head 33 from the indexing angle of rotary head 33 at which final component P in the components P to be picked up is picked up in the pick-up process (S2) to the indexing angle of rotary head 33 at which the indexing angle is made to coincide with the indexing angle at which initial component P is mounted in the mounting process (S4) may be divided into a rotation from the component supply position to the imaging position of part camera 41 and a rotation from the imaging position of part camera 41 to the imaging position of board camera 42.

As a result, in the electronic component mounting process, the required rotation amount of rotary head 33 from the imaging position of part camera 41 to the imaging position of board camera 42 can be reduced.

In the above-described embodiments, in the preparatory imaging process (S1), preparation imaging section 132 is described as storing center coordinates 35P of component holding sections 35 that are obtained based on the preparation images g obtained through imaging by part camera 41 in storage device 110 as preparation position information, but the present disclosure is not necessarily limited to this configuration. For example, in the preparatory imaging process (S1), preparation imaging section 132 may store preparation images g obtained through imaging by part camera 41 in storage device 110, and may obtain center coordinates 35P of component holding sections 35 based on preparation images g stored in storage device 110 for execution of the measurement process (S35) in the component holding state confirmation process (S3) or the component holding state confirmation process 2.

REFERENCE SIGNS LIST

1: electronic component mounter (component mounter), 33: rotary head, 35: component holding section, 41: part camera, 90A: first Z-axis driving device (lifting and lowering device), 90B: second Z-axis driving device (lifting and lifting and lowering device), 110: storage device, 130: image processing device, 131: component imaging section, 132: preparation imaging section, 133: angle information acquisition section, 134: extraction section; 135: measurement section, g: preparation image, G: component image, K: circuit board, P: electronic component (component), S1: preparatory imaging process (preparatory imaging step), S2: pick-up process (pick-up step), S31: angle information acquisition step, S32: extraction step, S34: component imaging step, S35: measuring step, S41: Pre-mounting indexing step, S133: pre-component imaging indexing step

The invention claimed is:

1. An electronic component mounting method for an electronic component mounter comprising:
 a rotary head configured to move between a component supply position and a circuit board and to be indexed to multiple indexing angles by rotating about an axis extending in a vertical direction;
 multiple component holding sections arranged in a circumferential direction centered at the axis of the rotary head and configured to hold electronic components;
 a part camera configured to image an electronic component held by each of the multiple component holding sections;
 a storage device configured to store an image of the electronic component obtained through imaging by the part camera; and
 an image processing device configured to process the image to thereby measure a positional deviation amount of the electronic component,
 the electronic component mounting method comprising:
 a preparatory imaging step of storing in the storage device multiple pieces of preparation position information of the component holding sections that are obtained based on preparation images imaged by the part camera with the multiple component holding sections not holding the electronic components and with the rotary head indexed to multiple indexing angles;
 a pick-up step of picking up the electronic components with the component holding sections;
 an angular information acquiring step of acquiring indexing angle information of the rotary head when a last electronic component of the electronic components is picked up in the pick-up step;
 an extraction step of extracting specific positional information from the multiple pieces of preparation position information based on the indexing angle information and multiple indexing angles of the rotary head imaged in the preparatory imaging step;
 a component imaging step of imaging the electronic components held by the multiple component holding sections with the indexing angle of the rotary head made to coincide with the indexing angle of the rotary head that corresponds to the specific information; and
 a measuring step of measuring a positional deviation amount between a position of the multiple component holding sections that is recognized from the specific positional information and a position of the electronic component that is recognized from a component image obtained in the component imaging step.

2. The electronic component mounting method according to claim 1,
 wherein in the extraction step, the specific positional information is extracted from the multiple pieces of preparation position information so that the rotation amount from the indexing angle of the rotary head at which final electronic component is picked up in the pick-up state to the indexing angle of the rotary head at which the part camera is caused to perform imaging is minimized.

3. The electronic component mounting method according to claim 2,
 wherein in the preparatory imaging step, the preparation position information obtained based on the multiple preparation images imaged by the part camera with the rotary head indexed to each of some indexing angles of all the indexing angles thereof is stored in the storage device, and
 wherein the electronic component mounting method comprises:
 a pre-component imaging indexing step in which if an indexing angle of the rotary head at which the final electronic component is picked up in the pick-up step does not coincide with an indexing angle of the rotary head that corresponds to the specific positional information, the rotary head is caused to rotate so that the indexing angle of the rotary head coincides with the indexing angle of the rotary head that corresponds to the specific positional information.

4. The electronic component mounting method according to claim 1,
 wherein in the preparatory imaging step, the preparation position information obtained based on the multiple preparation images imaged by the part camera with the rotary head indexed to each of all the indexing angles thereof is stored in the storage device.

5. The electronic component mounting method according to claim 4,
 wherein in the component imaging step, the electronic components held by the multiple component holding sections are imaged at the indexing angle of the rotary head at which the final electronic component is picked up in the pick-up step.

6. The electronic component mounting method according to claim 1,
 wherein the electronic component mounter comprises:
 a lifting and lowering device configured to lift up and lower the component holding section disposed in a lifting and lowering position to thereby pick up and mount the electronic component with the rotary head indexed to the indexing angle, the lifting and lowering device including a slider attached to a ball screw, and a motor, the ball screw lifting and lowering the slider by a driving force provided by the motor, and
 wherein the electronic component mounting method comprises:
 a pre-mounting indexing step of rotating the rotary head to an indexing angle at which the component holding section holding the electronic component that is initially mounted on the circuit board is disposed in the lifting and lowering position after the component imaging step is completed.

7. The electronic component mounting method according to claim 6, wherein the electronic component mounter comprises a multiple of the lifting and lowering positions, and
 wherein the lifting and lowering device lifts up and lowers each of the multiple component holding sections disposed in the multiple lifting and lowering positions in the multiple component holding sections.

8. The electronic component mounting method according to claim 1, wherein in the preparatory imaging step, the rotary head is imaged by the part camera in such a manner that all the multiple component holding sections fall within a visual field of the part camera, and wherein in the component imaging step, the electronic components held by the multiple component holding sections are imaged in such a manner that all the multiple component holding sections fall within the visual field of the part camera.

9. An electronic component mounter comprising:

a rotary head configured to move between a component supply position and a circuit board and to be indexed to multiple indexing angles by rotating about an axis extending in a vertical direction;

multiple component holding sections arranged in a circumferential direction centered at the axis of the rotary head and configured to hold electronic components;

a part camera configured to image an electronic component held by each of the multiple component holding sections;

a storage device configured to store an image of the electronic component obtained through imaging by the part camera; and an image processing device configured to process the image to measure a positional deviation amount of the electronic component, wherein the image processing device comprises:

a preparatory imaging section configured to image the multiple component holding sections using the part camera in such a manner that all the multiple component holding sections fall within a visual field of the part camera with the multiple component holding sections not holding the electronic components and with the rotary head indexed to multiple indexing angles and store multiple pieces of preparation position information of the component holding sections that are obtained based on imaged preparation images in the storage device;

an angular information acquiring section configured to acquire indexing angle information of the rotary head when the component holding section picks up a last electronic component of the electronic components;

an extraction section configured to extract specific positional information from the multiple pieces of preparation position information based on the indexing angle information and multiple indexing angles of the rotary head imaged by the preparatory imaging section;

a component imaging section configured to image the electronic components held by the multiple component holding sections in such a manner that all the multiple component holding sections fall within the visual field with the indexing angle of the rotary head made to coincide with the indexing angle of the rotary head based on the specific information; and a measuring section configured to measure a positional deviation amount between a position of the multiple component holding sections that is recognized from the specific positional information and a position of the electronic component that is recognized from a component image obtained through imaging by the component imaging section.

* * * * *